(12) United States Patent
Maeda et al.

(10) Patent No.: US 7,879,400 B2
(45) Date of Patent: Feb. 1, 2011

(54) SUBSTRATE PROCESSING APPARATUS, METHOD OF MANUFACTURING A SEMICONDUCTOR DEVICE, AND METHOD OF FORMING A THIN FILM ON METAL SURFACE

(75) Inventors: Takahiro Maeda, Toyama (JP); Kiyohiko Maeda, Imizu (JP); Takashi Ozaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 495 days.

(21) Appl. No.: 11/907,270

(22) Filed: Oct. 10, 2007

(65) Prior Publication Data
US 2008/0090415 A1  Apr. 17, 2008

(30) Foreign Application Priority Data
Oct. 10, 2006 (JP) ............................. 2006-276336
Jul. 30, 2007 (JP) ............................. 2007-198082

(51) Int. Cl.
*C23C 16/00* (2006.01)
(52) U.S. Cl. ............................. 427/255.19; 427/255.37; 427/523; 427/524; 427/96.7; 427/96.8; 427/255.26; 427/287; 427/295; 427/294; 427/597; 427/593; 427/585; 427/584; 427/579; 118/50; 118/50.1; 118/715; 118/722; 118/723 R; 118/723 VE; 118/724; 118/725; 118/719; 428/472; 428/472.1; 428/472.2; 428/336; 428/446; 428/469; 428/629; 428/697; 438/680; 438/765; 438/773; 438/770; 438/785; 148/95; 148/240; 148/280; 148/284; 148/606

(58) Field of Classification Search .......... 118/50–50.1, 118/715, 722, 723 R, 723 VE, 724, 725, 719; 438/680, 765, 773, 770, 758, 785; 106/1.05–1.29, 106/715–722, 723–733; 427/255.19, 255.37, 427/523, 524, 96.7–96.8, 255.26, 287, 295, 427/294, 597, 593, 585, 584, 579; 204/192.1, 204/192.38, 298.01–298.41; 392/388–389; 428/472, 472.1, 472.2, 336, 446, 469, 629, 428/697; 148/95, 240, 280, 284, 285, 286, 148/287, 606
See application file for complete search history.

(56) References Cited

U.S. PATENT DOCUMENTS 4,100,524 A * 7/1978 Kirsch ........................... 338/2
5,259,935 A * 11/1993 Davidson et al. ............ 148/286
6,805,968 B2 * 10/2004 Saito et al. .................. 428/469

FOREIGN PATENT DOCUMENTS

JP       A-09-263931       10/1997

(Continued)

*Primary Examiner*—Fernando L Toledo
*Assistant Examiner*—John P Dulka
(74) *Attorney, Agent, or Firm*—Oliff & Berridge, PLC (57) ABSTRACT

There is provided a substrate processing apparatus equipped with a metallic component, with at least a part of its metallic surface exposed to an inside of a processing chamber and subjected to baking treatment at a pressure less than atmospheric pressure. As a result of this baking treatment, a film which does not react with various types of reactive gases, and which can block the out diffusion of metals, is formed on the surface of the above-mentioned metallic component.

14 Claims, 6 Drawing Sheets

FOREIGN PATENT DOCUMENTS

| | | |
|---|---|---|
| JP | A-11-345772 | 12/1999 |
| JP | A-2003-041383 | 2/2003 |
| JP | 2003282553 A * | 10/2003 |
| JP | A-2003-282553 | 10/2003 |
| JP | A-2004-015975 | 1/2004 |

* cited by examiner

FIG. 6

SUBSTRATE PROCESSING APPARATUS, METHOD OF MANUFACTURING A SEMICONDUCTOR DEVICE, AND METHOD OF FORMING A THIN FILM ON METAL SURFACE

BACKGROUND OF THE INVENTION

1. Field of the Invention

The present invention relates to a substrate processing apparatus and a method of manufacturing a semiconductor device using this substrate processing apparatus, and more particularly relates to a substrate processing apparatus which has a film for minimizing metal contamination, a method of manufacturing a semiconductor device, and a method of forming a thin film on a metal surface.

2. Description of the Related Art

Generally, in order to process a substrate in a substrate processing apparatus, the processing chamber is formed from a heat-resistant glass such as quartz, silicon carbide, or the like in order to obtain heat resistance, corrosion resistance, and reaction resistance, and the furnace opening part used to load the substrate into and out of the processing chamber is formed from stainless steel, Hastelloy, or Inconel in order to achieve heat resistance and corrosion resistance.

However, a part of a metallic component forming the furnace opening parts is exposed to the inside of the processing chamber; therefore, if out diffusion of metal from the exposed surfaces of the furnace opening parts occurs during substrate processing such as film formation or the like, metal contamination in which metal is adsorbed on the film of the substrate may occur.

For example, since the manifold of the furnace opening part is formed from stainless steel or Hastelloy, and is exposed to the inside of the reaction chamber, metals contained in the metal forming the manifold, and especially Fe, undergo out diffusion, so that the problem of contamination of the substrate by Fe (iron) may arise.

Accordingly, a trial has been made in which a metallic component is heated beforehand for 4 hours to a temperature of 40° C. or greater in an atmosphere containing oxygen at atmospheric pressure or under a reduced pressure, so that an oxidation film is formed on a surface of the metallic component, and the out diffusion of Fe is suppressed by this oxidation film (Patent Document 1). Furthermore, the present inventors have confirmed that when a metallic component made of stainless steel or Hastelloy is heated under the processing conditions of Patent Document 1, an NiO film is formed as an oxidation film on a surfaces of the metallic component.

[Patent Document 1] Japanese Laid-Open Patent Publication No. 2003-282553

SUMMARY OF THE INVENTION

Problems to be Solved by the Invention

However, with the progress made in measurement techniques, and the higher purity of device control values, the problem of metal contamination of copper (Cu) from Fe has been pointed out, and even if an NiO film is formed on a surfaces of a metallic component formed from Cr-rich alloy materials containing iron such as stainless steel, Hastelloy, Inconel, or the like, and this is further coated with an Si3N4 film, the out diffusion of Cu contained in the metallic component in trace amounts occurs during substrate processing, and metal contamination occurs in which this diffused Cu is adsorbed on the substrate. As a result, defects may occur in the operating characteristics of the semiconductor device formed from the substrate.

In particular, in the formation of SiN films by the LP-CVD method using $SiH_2Cl_2$ (dichlorosilane) and NH3 (ammonia) and the formation of $SiO_2$ films by the LP-CVD method using $SiH_2Cl_2$ (dichlorosilane) and $N_2O$ (nitrogen dioxide), in the case of the initial rise after the assembly of the device, the level of contamination by metals centering on Cu cannot be immediately lowered to the control value or less, and it has been pointed out that this is a cause of a drop in productivity, drop in quality and the like.

Accordingly, it is an object of the present invention to form on a surface of a metal part a film which will not react with various types of reactive gases, and which can block the out diffusion of metals centering on copper.

Means Used to Solve the Problems

The present invention was devised in light of the above-mentioned problems, with a first aspect thereof being a substrate processing apparatus having a metallic component, with at least a part of its metallic surface exposed to an inside of a processing chamber, wherein at least the metallic surface of the abovementioned metallic component that is exposed to the inside of the abovementioned processing chamber is subjected to baking treatment at a pressure less than atmospheric pressure.

Effect of the Invention

In the present invention, a film that has a low reactivity with reactive gases, and that can block the out diffusion of Cu, can be formed on a surface of a metallic component exposed to the inside of the processing chamber. Furthermore, this can contribute to the prevention of defective operation of the semiconductor device caused by the out diffusion of Cu.

BEST MODE FOR CARRYING OUT THE INVENTION

An embodiment of the present invention will be described below with reference to FIGS. 1 through 4.

Figure 1:
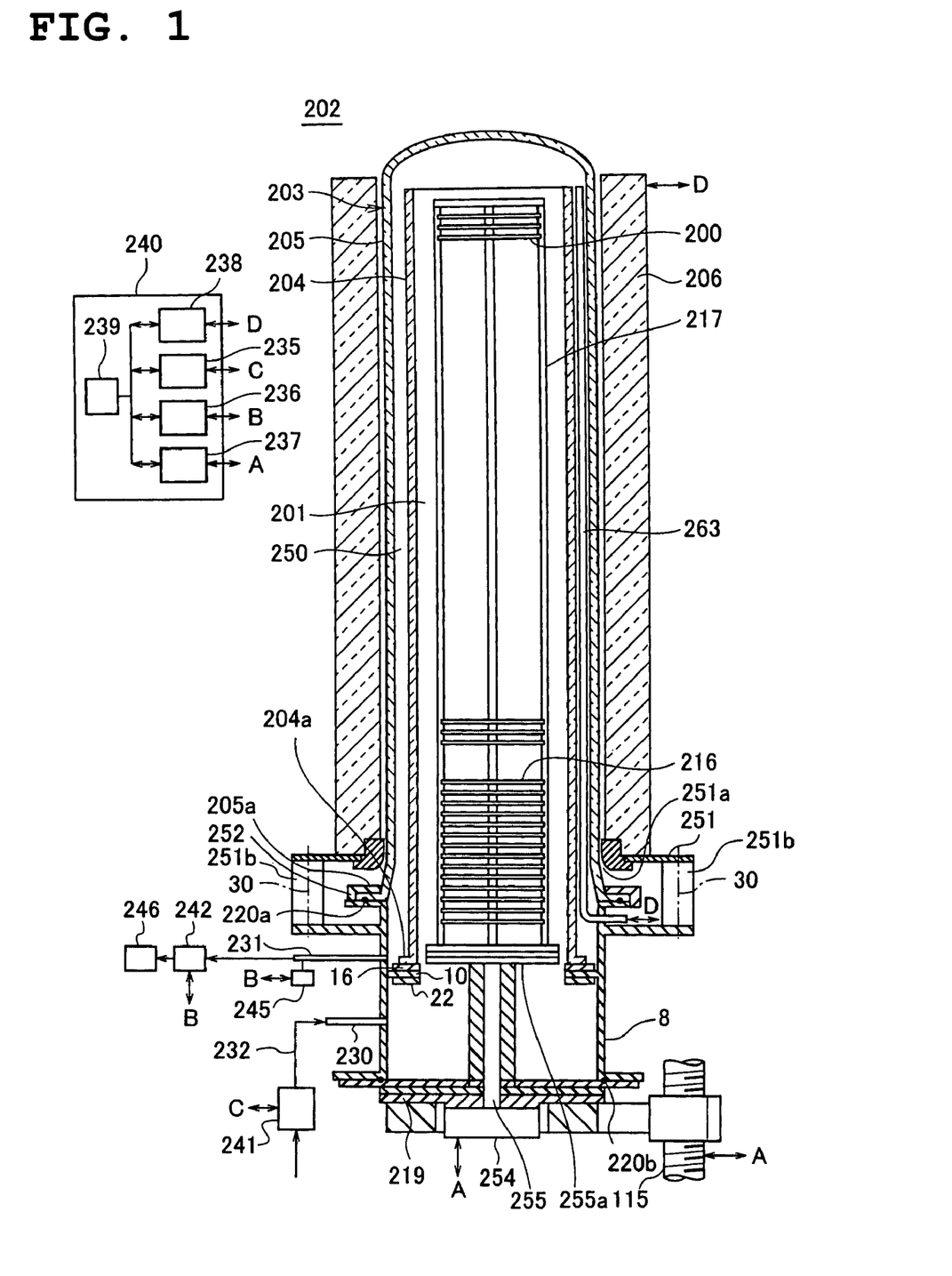
FIG. 1 is a longitudinal sectional view of the schematic construction of the processing furnace of the substrate processing apparatus appropriately used in an embodiment of the present invention.
Figure 2:
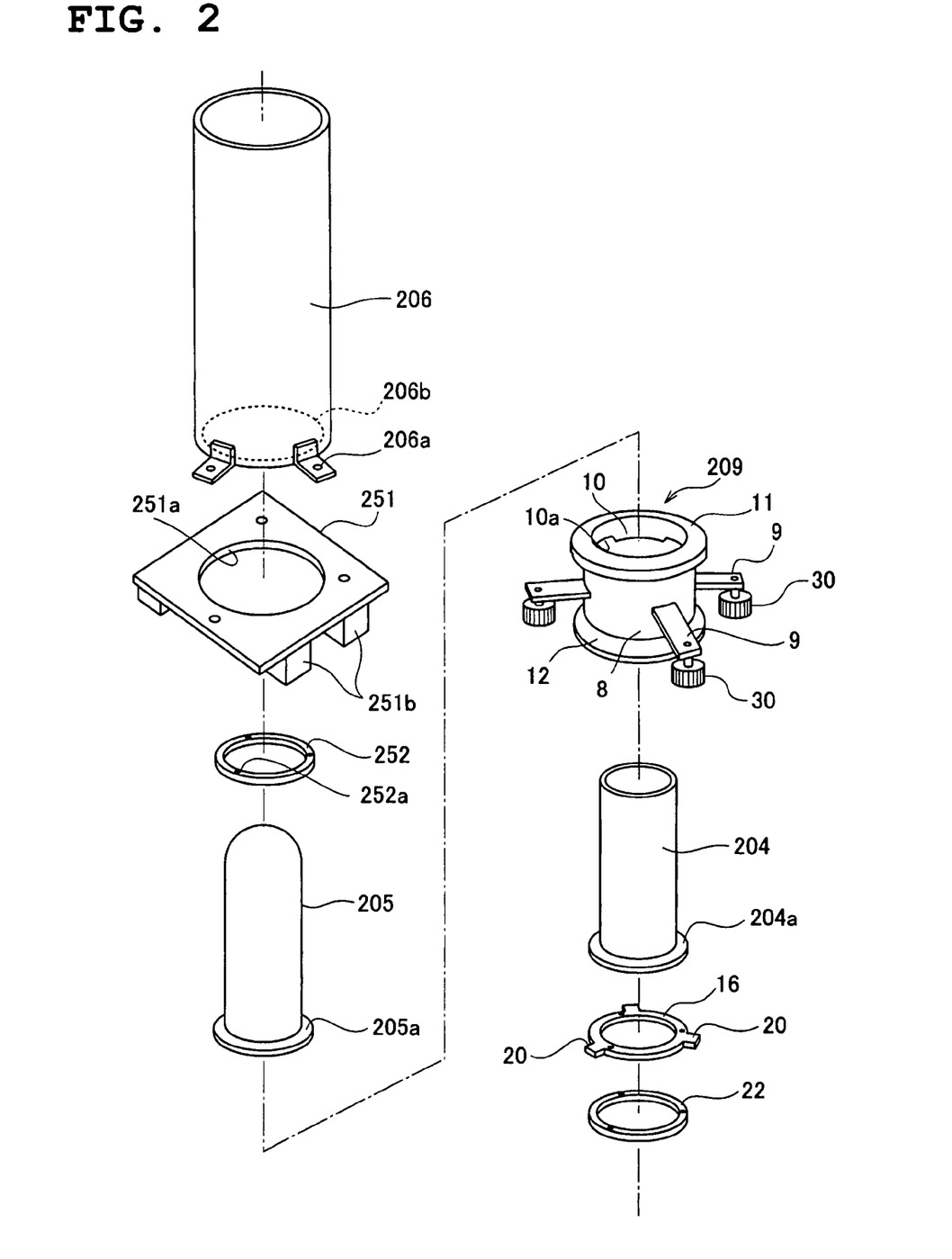
FIG. 2 is an exploded perspective view showing the construction of the substrate processing apparatus.

FIG. 1 is a longitudinal sectional view showing the schematic construction of the processing furnace of a substrate processing apparatus that can be appropriately used in an embodiment of the present invention. FIG. 2 is an exploded perspective view showing the construction of this substrate processing apparatus.

As is shown in FIGS. 1 and 2, a heater 206 is installed as heating means in the heating furnace 202.

The heater 206 is formed in a tubular shape that is open at the top and bottom. The heater 206 is attached in a vertical attitude via a bracket 206a to a heater base 251 used as a holding plate.

An insertion opening 251a is formed in the heater base 251 concentrically with the opening part 206b of the heater 206, and a processing tube 203 constructed from an inner tube 204 and an outer tube 205 is inserted into the heater 206 from the insertion opening 251a.

The outer tube 205 is formed in a dome shape that is closed at the upper end and open at the lower end, and the inner tube 204 is formed in a tubular shape that is open at both ends.

Furthermore, the outer tube 205 is fastened to a metal manifold 209 that is attached to the undersurface of the abovementioned heater base 251, and the inner tube 204 is supported on the manifold 209 via a receiving seat 16.

The abovementioned substrate processing apparatus shall now be described in detail with reference to FIGS. 1 and 2, an outer flange 205a is installed as a vacuum flange on the lower end part of the outer tube 205, and an outer flange 204a used for attachment is installed on the lower end part of the inner tube 204. Furthermore, the internal diameter of the outer tube 205 is greater than the external diameter of the inner tube 204. If the inner tube 204 is surrounded by the outer tube 205, then the interior of the inner tube 204 forms a processing chamber 201 for processing a wafer 200 as a substrate, and the space between the inner tube 204 and outer tube 205 forms a tubular space 250 for discharging substrate processing gases, purging gases, cleaning gases, and the like from the processing chamber 201.

The main body of the manifold 209 is constructed by a cylindrical tubular body 8. A plurality of arm parts 9 used to attach the manifold 209 to the heater base 251 are disposed on the outer circumferential surface of the tubular body 8, and an inner flange 10 used to support the abovementioned inner tube 204 is disposed on the inner circumferential surface of the tubular body 8 via a ring-form receiving seat 16. Furthermore, an outer flange 11 used to support the outer tube 205 is disposed on the upper part of the outer circumferential surface of the tubular body 8.

The abovementioned arm parts 9 are disposed at intervals in the circumferential direction. Each arm part extends horizontally to the outside of the tubular body 8, and a bolt 30 used for connection to the heater base 251 is disposed on the tip end part of each arm part 9.

The outer flange 205a of the outer tube 205 is seated on the outer flange 11 of the manifold 209 via an O-ring 220a as a sealing member, a metal fastening ring 252 is fit over the outer circumferential surface of the outer tube 205, and when a bolt connecting part 252a on this fastening ring 252 is connected by a bolt (not shown) to a bolt connecting part (not shown), the outer flange 11 of the outer tube 205 is integrated with the manifold 209 in a state in which this flange is clamped between the fastening ring 252 and the outer flange 205a of the manifold 209.

When the arm parts 9 of the manifold 209 are connected by the bolts 30 to a block 251b disposed on the undersurface of the heater base in a state in which the outer tube 205 is inserted into the heater 206, the outer tube 205 is disposed in the inside of the heater 206 concentrically with the heater 206.

Figure 3:
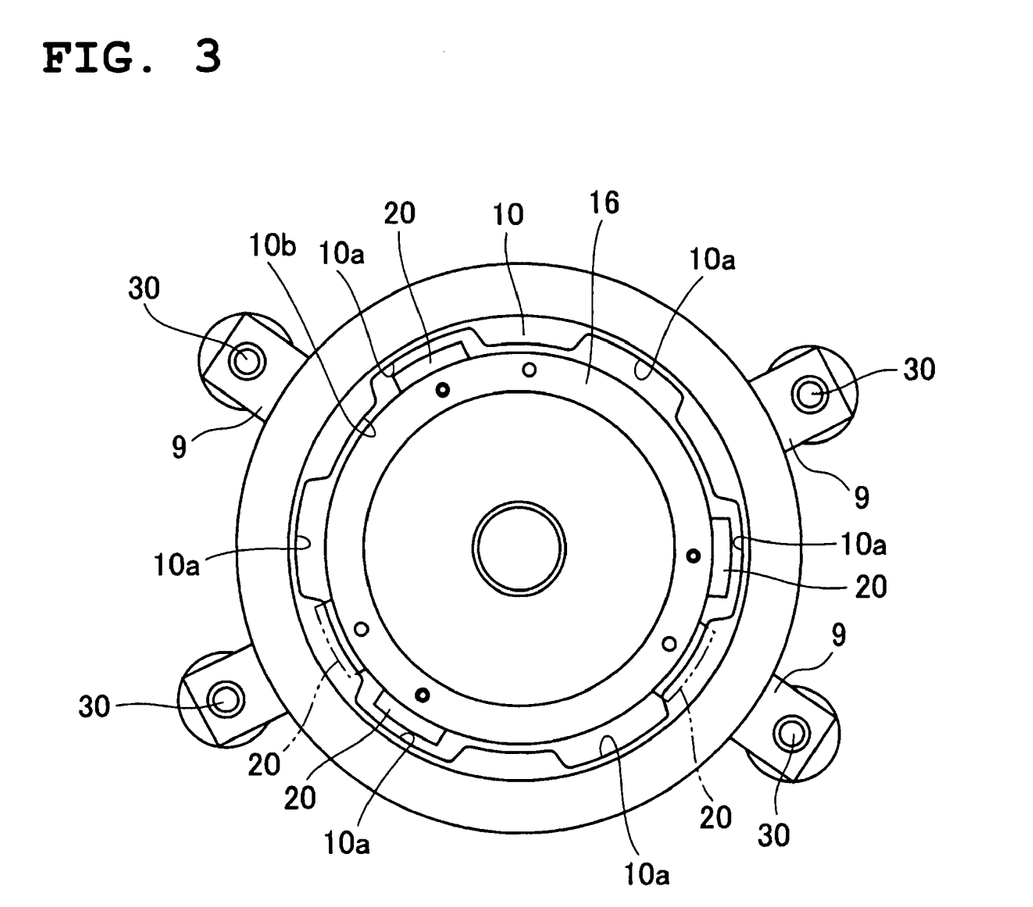
FIG. 3 is a plan view showing the structure used to support the inner tube on the manifold.

FIG. 3 is a plan view showing the structure used to support the inner tube 204 on the manifold 209. As is shown in FIGS. 2 and 3, the receiving seat 16 is formed in a ring shape. The receiving seat 16 is inserted into the tubular body 8 of the abovementioned manifold 209 in a state in which the inner tube 204 is carried. Cut-out parts 10a are formed in the shape of circular arcs in the inner flange 10 of the tubular body 8 at intervals in the circumferential direction, and peg parts 20 of a similar shape but smaller in size than the cut-out parts 10a are formed on the outer circumferential surface part of the receiving seat 16 at the same pitch as the cut-out parts 10a.

When the receiving seat 16 is pushed upward with each peg part 20 caused to face the corresponding cut-out part 10a in the inner flange 10 from below, the peg parts 20 pass through the cut-out parts 10a, and the receiving seat 16 passes through the insertion hole 10b of the inner flange 10.

When the receiving seat 16 is rotated about the axial center line of the tubular body 8 by ½ of the pitch between the cut-out parts 10a at the point in time at which the peg part 20 have been passed through the cut-out parts 10a, and the receiving seat 16 is passed through the insertion hole 10b, the peg parts 20 are disposed above the inner flange 10 between adjacent cut-out parts 10a, 10a. Subsequently, when the receiving seat 16 is lowered, the peg parts 20 are carried on the inner flange 10. As a result, the receiving seat 16 can be supported on the inner flange 10, and the inner tube 204 can be supported on the inner flange 10 via the receiving seat 16.

As is shown in FIG. 2, a metal sealing ring 22 used to fasten the receiving seat 16 to the manifold 209 is formed in a ring shape having substantially the same diameter as the receiving seat 16, and can be connected to the receiving seat 16 by bolts (not shown) via through-holes (not shown) that pass through the inner flange 10 of the manifold in the direction of thickness.

Accordingly, when the sealing ring 22 is connected by bolts to the receiving seat 16 after the receiving seat 16 is supported on the inner flange 10 of the manifold 209 in a state in which the inner tube 204 is supported on the receiving seat 16, the inner tube 204 is prevented from slipping out.

Furthermore, when the opposite of this procedure is performed, the inner tube 204 can be removed from the heater 206.

After a processing tube 203 made up of the inner tube 204 and outer tube 205 is assembled in the inside of the heater 206, a sealing cap 219 used as a furnace opening cover that closes off the lower opening in the manifold 209 is disposed beneath the manifold 209 as shown in FIG. 1.

This sealing cap 219 is constructed from a metal having a high heat resistance and corrosion resistance, and is supported by a boat elevator 115 used as an elevating-and-lowering mechanism that is disposed in a vertical attitude beneath the processing tube 203.

The rotating shaft 255 of a rotating mechanism 254 is made of metal; this shaft passes through the sealing cap 219 along the axial center line of the sealing cap 219, and is connected to a boat 217 via a flange 255a.

When the rotating shaft 255 is caused to rotate by the rotational driving force of the rotating mechanism 254, the boat 217 rotates about the axial center line of the inner tube 204. Specifically, the wafer 200 constituting a substrate is caused to rotate by rotating the boat 217 using the rotating shaft 255.

Furthermore, the boat 217 is loaded into or out of the processing chamber 201 by being elevated or lowered using the boat elevator 115.

An O-ring 220b used as a sealing member for sealing the space between the sealing cap 219 and the outer flange (vacuum flange) on the lower part of the manifold 209 is disposed on the upper surface of the abovementioned sealing cap 219, and the sealing cap 219 is tightly sealed to the outer flange 12 on the lower part of the manifold 209 in the vertical direction from below via this O-ring 220b.

A driving control part 237 is electrically connected to the rotating mechanism 254 and boat elevator 115, and these parts are controlled with the desired timing so that desired rotation and elevating-and-lowering operations are performed.

A nozzle 230 is attached to the below the inner flange 10 of the abovementioned tubular body 8, and a gas supply tube 232 is connected to the nozzle 230.

A processing gas supply source and inert gas supply source (not shown) are connected to the upstream side of the gas supply tube 232, which is the opposite side from the connection side with the nozzle 230, via an MFC (mass flow controller) used as a gas flow rate controller.

A gas flow rate control part 235 is electrically connected to the MFC 241, and is constructed so that control is performed with a desired timing such that the flow rates of the gases supplied are maintained at desired amounts.

Furthermore, an exhaust tube 231 which evacuates the atmosphere in the inside of the processing chamber 201 is disposed on the abovementioned tubular body 8 above the inner flange 10. The exhaust tube 231 is disposed so that this tube is positioned in the lower end part of the tubular space 250 that is formed by the gap between the inner tube 204 and outer tube 205, and so that this tube communicates with this tubular space 250.

A vacuum exhaust device 246 such as a vacuum pump or the like is connected via a pressure sensor 245 used as a pressure detector, and a pressure adjustment device 242, to the downstream side of the exhaust tube 231, which is the opposite side from the side connected to the manifold 209, and this is constructed so that a vacuum exhaust can be obtained in such a manner that the pressure in the inside of the processing chamber 201 is maintained at a desired pressure (degree of vacuum).

A pressure control part 236 is electrically connected to the pressure adjustment device 242 and pressure sensor 245, and the pressure control part 236 controls the pressure in the inside of the processing chamber 201 with a desired timing using the pressure adjustment device 242 on the basis of the pressure detected by the pressure sensor 245 so that this pressure is maintained at a desired pressure.

For example, the boat 217 used as a substrate holder is made of a heat-resistant material such as quartz, silicon carbide, or the like, and is constructed so as to hold a plurality of wafers 200 in multiple stages in a horizontal attitude and in a state in which the centers of the wafers are lined up in a uniform arrangement.

Furthermore, for purposes of heat insulation, a plurality of adiabatic plates 216 used as heat-insulating members which have a circular disk shape, and which are made of a heat-insulating material such as quartz, silicon carbide, or the like, are disposed in multiple stages in a horizontal attitude in the lower part of the boat 217.

Accordingly, heat from the heater 206 is blocked by the adiabatic plates 216, and heating on the side of the manifold 209 by the heater 206 can be prevented.

A temperature sensor 263 is disposed as a temperature detector in the inside of the processing tube 203. A temperature control part 238 used for electrical control of the temperature is connected to the heater 206 and temperature sensor 263.

The temperature control part 238 is constructed so that this part controls the temperature in the inside of the processing chamber 201 by adjusting the power supplied to the heater 206 on the basis of temperature information detected by the temperature sensor 263 in such a manner that the temperature in the inside of the processing chamber 201 has a desired temperature distribution.

The gas flow rate control part 235, pressure control part 236, driving control part 237, and temperature control part 238 form operating parts and input-output parts, and are electrically connected to a main control part 239 that controls the substrate processing apparatus as a whole. The gas flow rate control part 235, pressure control part 236, driving control part 237, temperature control part 238, and main control part 239 are constructed as a controller 240.

A metallic component exposed to the processing chamber 201, such as the abovementioned manifold 209, receiving seat 16, sealing ring 22, sealing cap 219, rotating shaft 255, flange 255a, or the like (hereafter referred to collectively as "metallic component") requires heat resistance and corrosion resistance; accordingly, these parts are formed from nickel-chrome alloys (iron-nickel-chrome alloys), e.g., alloys such as Fe-rich stainless steel, or Hastelloy that is richer in Ni than Fe, preferably Hastelloy C-22 (Ni 56%, Cr 22%, Fe 3%, and the like), Inconel that is richer in Ni than Fe (Ni 61%, Cr 21.5%, Fe 2.5%, and the like), or the like.

Furthermore, a $Cr_2O_3$ film or SiOCr film, or a film formed by laminating an SiOCr film and a $Cr_2O_3$ film (not shown) is formed by baking treatment under reduced pressure on at least a surface of the abovementioned metallic component exposed to the inside of the processing chamber 201.

$Cr_2O_3$ films and SiOCr films have a slower diffusion rate than NiO films; furthermore, such films have a large blocking effect on Cu which is contained in trace amounts in the abovementioned metallic component, and prevent the out diffusion of metals centering on Cu. Furthermore, $Cr_2O_3$ films and SiOCr films are less reactive than NiO films, so that there is little danger of peeling or cracking due to reactions with reactive gases. Accordingly, the out diffusion of metals is prevented, and film formation can be performed by an LP-CVD method in a state in which there is no metal contamination. Furthermore, in a laminated film of a $Cr_2O_3$ film and an SiOCr film, an SiOCr film may be formed on top of a $Cr_2O_3$ film, or a $Cr_2O_3$ film may be formed on top of an SiOCr film.

Next, the method used to form the abovementioned $Cr_2O_3$ film or SiOCr film will be described. Furthermore, the $Cr_2O_3$ film or SiOCr film may be formed by baking treatment in a component stage; however, considering contamination in the loading and handling stages, it is desirable to perform this film formation in a stage in which the operations are completed in the substrate processing apparatus.

However, in cases where the baking temperature zone for parts is set at 300° C. or greater, if baking treatment is performed after assembly in the substrate processing apparatus, there is a danger that O-rings and the like will deteriorate; in such cases, therefore, it is advisable to perform baking treatment under reduced pressure in a component stage before the metallic component is fitted to the substrate processing apparatus. In particular, the inlet adapter 209, rotating shaft 225, and sealing cap 219 are adjacent to the O-rings 220a and 220b; accordingly, it is advisable to perform baking treatment of these parts beforehand under reduced pressure in a component stage. Processing methods of forming Cr2O3 films and SiOCr films on the metallic component by baking treatment under reduced pressure include the following first through fourth methods.

[First Method]

In this method, first of all, the above-mentioned processing chamber 201 filled with a cleaned atmosphere (air) in a state in which the boat 217 is removed is closed, and the pressure in the inside of the processing chamber 201 is reduced to a pressure that is less than atmospheric pressure, preferably a pressure of 1 torr or less, by evacuation of the atmosphere in the inside of the processing chamber 201 by a vacuum exhaust device 246 such as the abovementioned vacuum pump or the like. In this case, a state is achieved in which a slight amount of air is left in the inside of the processing chamber 201.

Next, the abovementioned heater 206 is heated, and the atmosphere in the inside of the processing chamber 201 is heated for 60 minutes or longer so that the temperature of at least an exposed surfaces of a metallic component is raised to 200° C. or greater, preferably 300 to 600° C., and a $Cr_2O_3$ film is formed on the surfaces of the abovementioned metallic component (metallic component exposed to the processing chamber 201 such as the abovementioned manifold 209, fastening ring 252, sealing ring 22, sealing cap 219, rotating shaft 255, flange 255a, or the like). Preferably, heating is performed by the heater 206 for 60 minutes or longer so that a surface of the abovementioned metallic component is heated to 200° C. or greater, preferably 300 to 600° C. For example, in cases where an exposed surface of the metallic component in the inside of the processing chamber 201 is heated to 200° C. or greater, the temperature of the heater 206 is raised to 600° C. or greater.

In this method, the $Cr_2O_3$ film may be formed as follows.

First, in a high-temperature vacuum atmosphere, the migration (movement) of metal atoms becomes active on the clean metallic surfaces on which there is no FeO film.

Then, respective atoms of iron (Fe), nickel (Ni), chromium (Cr), and the like move and coagulate from differences in their own diffusion rates, and Cr collects on a surface of a metallic component.

Subsequently, the surface of the Cr deposited on the surface of the metallic component reacts with oxygen ($O_2$) and moisture ($H_2O$) in the atmosphere, and a $Cr_2O_3$ film is finally formed.

When baking treatment was performed at atmospheric pressure for purposes of comparison, only a thin NiO film was formed on an exposed surface of the abovementioned metallic component regardless of how the temperature of the baking treatment was set. Furthermore, even when baking treatment was performed on metallic component to which a NiO film had been fixed, the NiO film interfered, and a $Cr_2O_3$ film could not be formed.

Accordingly, in order to form a $Cr_2O_3$ film on an exposed surface of the abovementioned metallic component, it is necessary to set the pressure in the inside of the processing chamber 201 during baking treatment at a pressure that is lower than atmospheric pressure.

Furthermore, even when the pressure in the inside of the processing chamber 201 is less than atmospheric pressure, it is difficult to form a $Cr_2O_3$ film in cases where the baking temperature is less than 200° C.

Accordingly, in order to form a $Cr_2O_3$ film on a surface of the abovementioned metallic component, it is necessary to set the pressure in the inside of the processing chamber 201 at a pressure that is less than atmospheric pressure, and to set the temperature of the atmosphere in the processing chamber 201 so that the temperature of the metallic surfaces is at least 200° C., preferably 300 to 600° C.

[Second Method]

In this method, a Cr2O3 film is first formed by the first method; next, a SiOCr film is laminated on top of the $Cr_2O_3$ film.

After the first method, an Si-containing hydrogen compound gas which contains Si as film-forming gas, e.g., dichlorosilane ($SiH_2Cl_2$, hereafter referred to as "DCS") gas, silane ($SiH_4$) gas, or disilane ($Si_2H_6$) gas and $NH_3$ gas, is supplied to the abovementioned processing chamber 201 in a state in which the boat 217 is removed, and the atmosphere in the inside of the processing chamber 201 is set as an atmosphere of this Si-containing hydrogen compound gas and NH3 gas.

Next, the pressure in the inside of the processing chamber 201 is maintained at a pressure that is lower than atmospheric pressure, preferably a pressure of 1 torr or less, by evacuation of the atmosphere in the inside of the processing chamber via the vacuum exhaust device 246, and heat treatment (baking treatment) is continuously performed for 240 minutes or longer by heating using the heater 206 so that the temperature in the inside of the processing chamber 201 on at least a surface of the metallic component is maintained at 200° C. or greater, preferably 300 to 600° C. A SiOCr film is thus laminated on top of the $Cr_2O_3$ film on the abovementioned metallic component.

Furthermore, for example, in cases where an exposed surface of the metallic component in the inside of the processing chamber 201 is heated to 200° C. or greater, the temperature of the heater 206 is heated to 600° C. or greater.

In this method, it is inferred that the abovementioned SiOCr film be formed as follows.

First, on a surface sides of the abovementioned metallic component, i.e., the side on which the Cr2O3 film is formed, the migration (movement) of metal atoms becomes active, and a portion of the $Cr_2O_3$ film reacts with the silicon (Si) contained in the carbide such as DCS or the like, so that an SiOCr film is finally formed on top of the $Cr_2O_3$ film.

If only baking treatment at atmospheric pressure is performed, as was described in the first baking method, the desired $Cr_2O_3$ film cannot be formed, and a SiOCr film cannot be formed on top of this, either.

[Third Method]

In the third method, the processing chamber 201 is closed in a state in which the boat 217 is removed, and the interior of the processing chamber 201 is placed in inert gas, e.g., N2 (nitrogen) atmosphere at a pressure lower than atmospheric pressure, preferably 1 torr or less, by evacuating the interior of the processing chamber 201 using the vacuum exhaust device 246, and supplying inert gas.

Next, baking treatment is continuously performed for 60 minutes or longer by heating with the heater 206 so that that the temperature of the atmosphere in the inside of the processing chamber 201 at least on a surfaces of a metallic component is increased to 200° C. or greater, preferably 300 to 600° C.

Furthermore, for example, in cases where an exposed surface of a metallic component in the inside of the processing chamber 201 is heated to 200° C. or greater, the temperature of the heater 206 is increased to 600° C. or greater.

Next, while the temperature in the inside of the processing chamber 201 is maintained at 200° C. or greater using the heater 206, cleaned atmospheric air is introduced into the processing chamber 201, the processing chamber 201 is returned to atmospheric pressure, and the exposed surface of the abovementioned metallic component is reacted with oxygen in the atmosphere for 60 minutes or longer, preferably 1 to 40 hours. As a result, a $Cr_2O_3$ film is formed on the surface of the abovementioned metallic component. Furthermore, for example, in cases where the exposed surface of the metallic component in the inside of the processing chamber 201 is heated to 200° C. or greater, the temperature of the heater 206 is heated to 600° C. or greater.

In this method, it is inferred that the abovementioned $Cr_2O_3$ film is formed as follows.

First, the migration (movement) of metal atoms becomes active on an exposed surface of the abovementioned metallic component in the high-temperature atmosphere of N2 gas (nitrogen); atoms of iron (Fe), nickel (Ni), chromium (Cr), and the like move and coagulate because of the differences in their own diffusion rates; and Cr collects on the surfaces.

Next, the surface of the Cr deposited on the surfaces reacts with oxygen ($O_2$) and moisture ($H_2O$) in the atmosphere so that a $Cr_2O_3$ film is finally formed.

When only baking treatment at atmospheric pressure was performed for purposes of comparison, the NiO film formed on the surfaces interfered as described above, so that the formation of the desired $Cr_2O_3$ film was difficult.

[Fourth Method]

In the fourth method, the processing chamber is closed in a state in which the boat 217 is removed, and the interior of the processing chamber 201 is placed in an atmosphere of a DCS gas used as an Si-containing hydrogen compound gas, and $NH_3$ gas, at a pressure that is less than atmospheric pressure, preferably 1 torr or less, by evacuation using the vacuum exhaust device 246, and the supply of an Si-containing hydrogen compound gas containing Si, e.g., DCS gas, and $NH_3$ gas.

Next, the temperature of the atmosphere in the inside of the processing chamber 201 is continuously heated for 240 minutes or longer by heating with the heater 206 to a temperature of 200° C. or greater, preferably 300 to 600° C.

Furthermore, for example, in cases where an exposed surface of the metallic component in the inside of the processing chamber 201 is heated to 200° C. or greater, the temperature of the heater 206 is increased to 600° C. or greater.

After the completion of heating, the atmosphere in the inside of the processing chamber 201, i.e., the atmosphere composed of the DCS gas and NH3 gas, is evacuated from the processing chamber 201 while the temperature of the atmosphere in the inside of the processing chamber 201 is maintained at 200° C. or greater using the heater 206.

After evacuation is completed, the processing chamber 201 is returned to atmospheric pressure by introducing cleaned atmospheric air into the processing chamber 201 while the temperature of the atmosphere in the inside of the processing chamber 201 is maintained at 200° C. or greater, and a surface of the abovementioned metallic component is reacted with oxygen in the atmosphere for 60 minutes or longer, preferably 1 to 40 hours.

When the surface of the metallic component reacts with oxygen in the atmosphere, an SiOCr film (Si—O—Cr film) is formed on the surface of the abovementioned metallic component.

In this method, it is inferred that the abovementioned SiOCr film is formed as follows.

First, the migration (movement) of metal atoms becomes active at a surface of the abovementioned metallic component in the high-temperature vacuum atmosphere; atoms of iron (Fe), nickel (Ni), chromium (Cr), and the like move and coagulate from the differences in their own diffusion rates; and Cr collects on the surfaces.

Next, the surface of the Cr deposited on the surfaces reacts with the silicon (Si) contained in the hydrogen compound gas such as DCS gas or the like. Subsequently, this reacts with oxygen and moisture in the atmosphere, so that a SiOCr film is finally formed.

Figure 4:
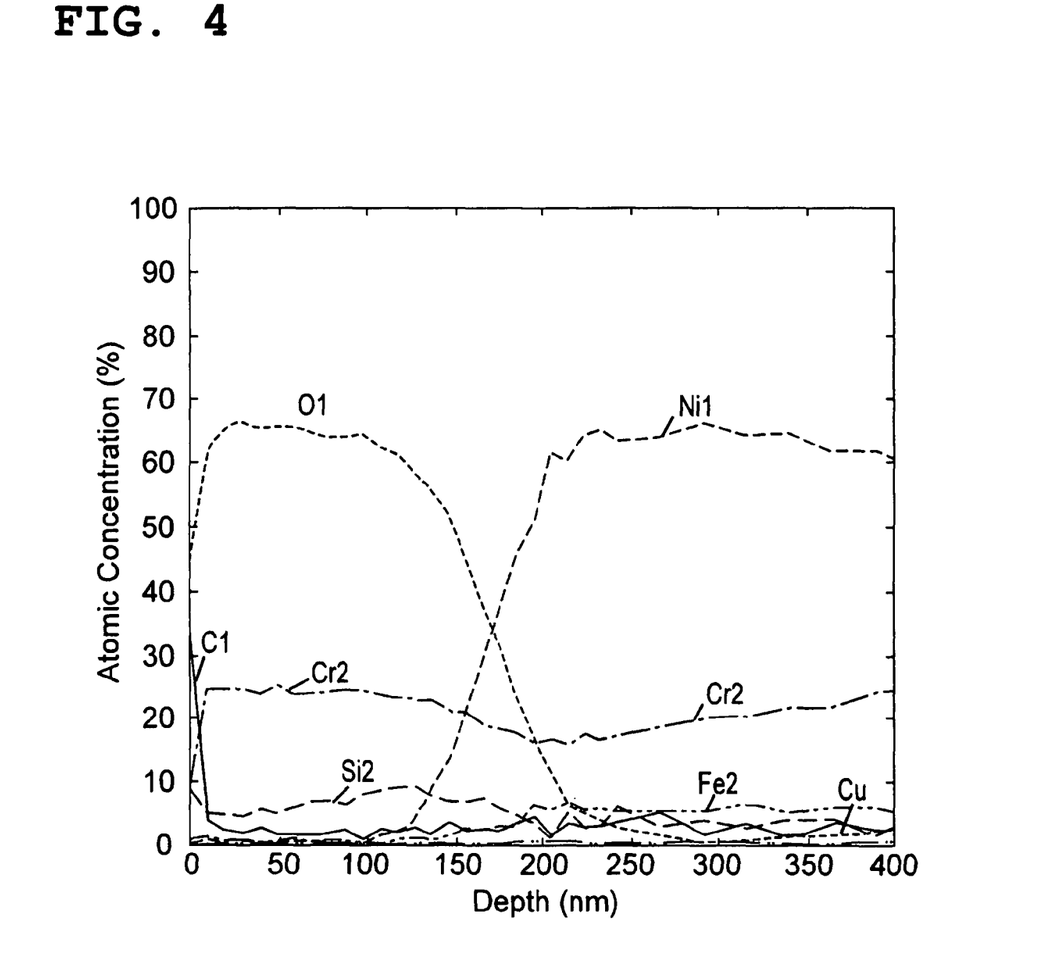
FIG. 4 is a diagram showing the surface composition of the abovementioned metallic component (manifold or the like) made of Hastelloy when baking treatment is performed by the first method in a vacuum.
Figure 5:
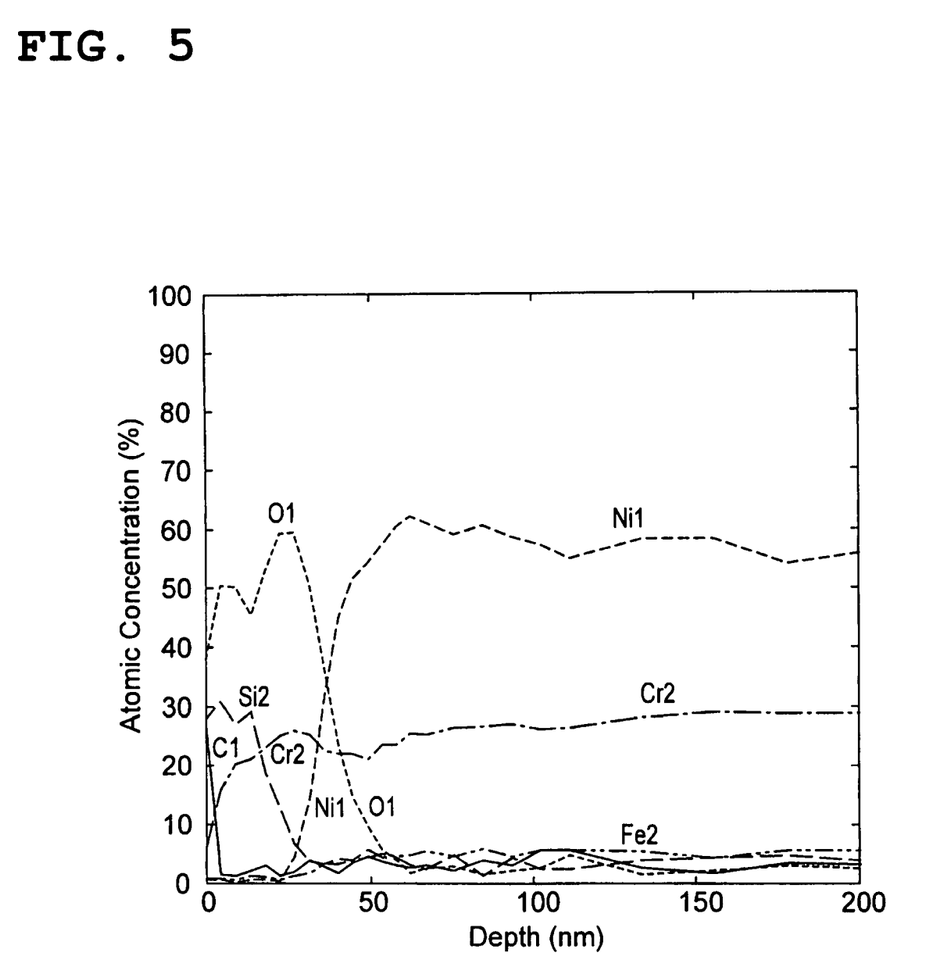
FIG. 5 is a diagram showing the composition when baking treatment is performed by the fourth method on a surface of the abovementioned metallic component constructed from Hastelloy in a mixed gas atmosphere of DCS and ammonia gas.

FIG. 4 shows the surface composition of the abovementioned metallic component (manifold or the like) made of Hastelloy when baking treatment is performed by the first method in a vacuum. FIG. 5 shows the composition in a case where baking treatment is performed on a surface of the abovementioned metallic component constructed from Hastelloy by the fourth method in a DCS gas and ammonia gas atmosphere. Furthermore, in FIGS. 4 and 5, the vertical axis shows the atomic concentration of Cu, and the horizontal axis shows the depth from the surface.

It is seen from the surface compositions in FIGS. 4 and 5 that Cr collects on the metal surface side.

Furthermore, it appears in FIG. 4 that the Cr2O3 film is formed to a thickness extending from a surface of the metallic component to the intersection point between oxygen O1 and nickel Ni1, and it appears in FIG. 5 that the SiOCr film is formed to a thickness extending from a surface of the metallic component to the intersection point between oxygen O1 and nickel Ni1.

Figure 6:
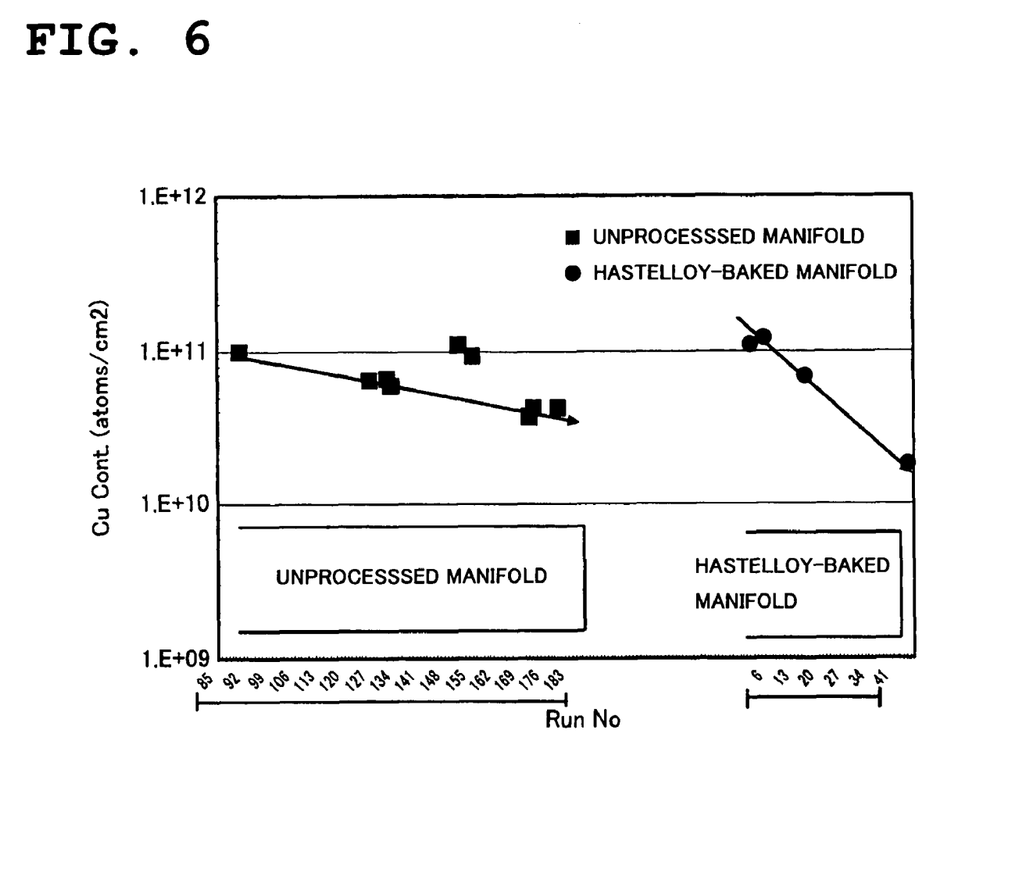
FIG. 6 is a diagram showing the relationship between the rpm of the substrate processing and the amount of adsorption of Cu in the film of the substrate for each substrate processing in a case where film formation was performed using the substrate processing apparatus.

FIG. 6 shows the relationship between the rpm of the substrate processing and the amount of adsorption of Cu on the film of the substrate for each substrate processing in a case where film formation was performed in the substrate processing apparatus. The horizontal axis shows the rpm (RUN No.) for various types of substrate processing, and the vertical axis shows the amount of adsorption of Cu in the film of the substrate for each substrate processing.

In the drawings, black squares indicate the relationship between the rpm of substrate processing and the amount of adsorption of Cu on the film of the substrate for each substrate processing in the case of a substrate processing apparatus in which a Hastelloy manifold not subjected to baking treatment (hereafter referred to as unprocessed manifold) was assembled, and black circles indicate the relationship between the rpm of substrate processing and the amount of adsorption of Cu on the film of the substrate for each substrate processing in the case of a substrate processing apparatus in which a Hastelloy manifold subjected to baking treatment (hereafter referred to as Hastelloy-baked manifold) was assembled.

As is shown in FIG. 6, in the initial startup of the substrate processing apparatus, Cu remains in the inside of the substrate processing system containing the substrate processing apparatus.

The Cu is gradually diminished in the inside of the substrate processing system as the processing rpm is increased, and therefore adsorbs on the substrate film in fixed amounts. The amount of Cu in the inside of the substrate processing system is accordingly reduced as substrate processing is repeated. However, in the substrate processing apparatuses with an unprocessed manifold attached, even if the rpm of the substrate processing is increased, there is no drop in the amount of Cu adsorbed on the film on the substrate. On the other hand, in the substrate processing apparatuses with a Hastelloy-baked manifold attached, the following results were obtained: namely, even though the amount of Cu adsorption in the film on the substrate was the same during repetition of substrate processing and in the initial rise, the amount of adsorption of Cu on the film on the substrate dropped at extremely low rpm values.

The only point of difference in construction between the former substrate processing apparatuses and the latter substrate processing apparatuses is the difference between the unprocessed manifold and the Hastelloy-baked manifold.

Accordingly, in the substrate processing apparatuses with an unprocessed manifold assembled, it is evident that the source of metal contamination is the manifold 209 for the processing chamber, and that a drop in the absolute amount of Cu in the substrate processing system is prevented by the out diffusion of Cu from the manifold 209. It is seen that the Cr2O3 film and SiOCr film function as films that prevent the out diffusion of Cu from the metallic component.

Furthermore, in the component stage of the abovementioned metallic component, the abovementioned metallic component may be placed in the vacuum heating furnace (not shown), and a $Cr_2O_3$ film or SiOCr film, or a film laminating a $Cr_2O_3$ film and SiOCr film (not shown), may be formed by the abovementioned methods 1 through 4. In this case, masking is used in cases where a $Cr_2O_3$ film or SiOCr film, or a film laminating a $Cr_2O_3$ film and SiOCr film, is formed only on the surfaces that are exposed to the processing chamber 201, and this masking is removed after baking treatment.

Furthermore, in the first through fourth methods, it is desirable that a surface of the abovementioned metallic component be subjected to polishing treatment by electrolytic polishing or mechanical polishing as a pre-treatment prior to baking treatment.

If a surface of the metallic component is subjected to polishing treatment as a pre-treatment, the FeO film or NiO film formed on the surfaces during material casting can be removed; accordingly, the formation of the $Cr_2O_3$ film or SiOCr film is facilitated.

Next, the method used to form thin films on wafers 200 as one step of a semiconductor device manufacturing process using a processing furnace 202 will be described. Furthermore, in the following description, the operations of the respective parts making up the substrate processing apparatus are controlled by the abovementioned controller 240.

When a plurality of wafers (substrates) 200 are loaded into the boat 217 (wafer charging), as is shown in FIG. 1, the boat 217 holding the plurality of wafers 200 is elevated by the boat elevator 115, and loaded into the processing chamber 201 (boat loading). In this state, the sealing cap 219 is placed in a sealed state on the lower end of the manifold 209 via the O-ring 220b (wafer loading step).

Vacuum evacuation is performed by the vacuum exhaust device 246 so that the interior of the processing chamber 201 is set at a desired pressure (degree of vacuum). In this case, the pressure in the inside of the processing chamber 201 is measured by the pressure sensor 245, and the pressure adjustment device 242 is feedback-controlled on the basis of this measured pressure. Furthermore, heating is performed by the heater 206 so that the interior of the processing chamber 201 is maintained at the desired temperature.

In this case, the powering of the heater 206 is feedback-controlled on the basis of the temperature information detected by the temperature sensor 263 so that the desired temperature distribution is obtained in the inside of the processing chamber 201. Then, the wafers 200 are rotated by rotating the boat 217 using the rotating mechanism 254.

Furthermore, the surfaces of the manifold 209 for the processing furnace 202, fastening ring 252, sealing ring 22, sealing cap, rotating shaft and flange that are exposed to the processing chamber 201 are covered by a $Cr_2O_3$ film or SiOCr film, or a film laminating a $Cr_2O_3$ film and SiOCr film, as described above, and no out diffusion of metals centering on Cu occurs. Accordingly, it was possible to lower the value of Cu in the substrate processing system to the desired control value or less merely by repeating substrate processing several times to several tens of times using wafers (dummies) 200.

The temperature and pressure of the processing chamber 201 are adjusted to a temperature and pressure that are suitable for substrate processing, and a substrate processing gas is supplied from a processing gas supply source in a state in which this state is maintained. The substrate processing gas is controlled to the desired flow rate by the MFC 241; this gas passes through the gas supply tube 232, and is introduced into the processing chamber 201 from the nozzle 230. The substrate processing gas that is introduced into the processing chamber 201 contacts the $Cr_2O_3$ film or SiOCr film, or film laminating a $Cr_2O_3$ film and SiOCr film, that covers the surfaces of the manifold 209, fastening ring 252, sealing ring 22, sealing cap 219, rotating shaft 255, and flange 255a that are exposed to the processing chamber 201. However, the $Cr_2O_3$ film or SiOCr film is non-reactive with respect to the reactive gases; accordingly, these films are not stripped by reactions, and cracking likewise does not occur.

The substrate processing gas rises through the processing chamber 201, and flows out into the tubular space 250 from the upper end opening of the inner tube 204 as the used substrate processing gas; this gas is discharged from the exhaust tube 231. When the substrate processing gas passes through the interior of the processing chamber 201, this gas contacts the surfaces of the wafers 200. In this case, a thin film is deposited (deposition) on the surfaces i of the wafers 200 by a thermal CVD reaction (substrate heat treatment step).

When the pre-set processing time has elapsed, inert gas is supplied from inert gas supply source, the gas in the inside of the processing chamber 201 is replaced by this inert gas, and the pressure in the inside of the processing chamber 201 is returned to ordinary pressure.

Subsequently, the sealing cap 219 is lowered by the boat elevator 115, the lower end of the manifold 209 is opened, and the processed wafers 200 held in the boat 217 are loaded to the outside of the processing tube 203 from the lower end of the manifold 209 (boat unloading) (substrate unloading step). Afterward, the processed wafers 200 are removed from the boat 217 (wafer discharging).

Furthermore, as one example of the processing conditions used to process the wafers in the processing furnace of the present embodiment, in the formation of the SiN film, the processing temperature is 600 to 800° C., the processing pressure is 30 to 500 Pa, and the gas types and gas flow rates are ($SiH_2Cl_2$ gas: 20 to 50 sccm, $NH_3$ gas: 180 to 200 sccm). Processing of the wafers 200 is performed with these processing conditions constantly maintained at values in these respective ranges.

Effect of the Embodiment

In the substrate processing apparatus of the present embodiment, the following superior effects are manifested. Conventionally, a time of 2 weeks to 3 weeks was required to reach mass production from start-up of the substrate processing apparatus; however, in the substrate processing apparatus of the present embodiment, the time from start-up to mass production can be greatly reduced. Furthermore, this can be used as an apparatus that has a low level of metal contamination compared to a conventional substrate processing apparatus. Furthermore, the level of metal contamination after irregular work such as maintenance and the like can also be reduced.

[Addendum]

Aspects of the manufacture of the substrate processing apparatus and the semiconductor device of the present embodiment are added below.

A first aspect is a substrate processing apparatus equipped with a metallic component, with at least a part of its metallic surface exposed to an inside of a processing chamber 201 and subjected to baking treatment at a pressure less than atmospheric pressure.

Here, for example, the metallic component may be the manifold 209, fastening ring 252, sealing ring 22, sealing cap 219, rotating shaft 255, or flange 255*a*. When at least the metallic surface of the abovementioned metallic component that is exposed to the inside of the processing chamber 201 is subjected to baking treatment at a pressure less than atmospheric pressure, an NiO film is not formed, and a $Cr_2O_3$ film is formed, on the metallic surface. The $Cr_2O_3$ film does not react with reactive gases; accordingly, no peeling or cracking occurs. Furthermore, this $Cr_2O_3$ film blocks the out diffusion of metals centering on Cu contained in the metallic component, and prevents metal contamination.

A second aspect is the first aspect, wherein the baking treatment to at least the metallic surface of the metallic component exposed to the inside of the processing chamber 201 is performed at a pressure less than atmospheric pressure, in a state of filling a surrounding area with inert gas.

The inert gas atmosphere acts to clean the metallic surface exposed to the inside of the processing chamber 201.

A third aspect is the first aspect, wherein the baking treatment to at least the metallic surface of the metallic component exposed to the inside of the processing chamber 201 is performed at a pressure less than atmospheric pressure, in a state of filling a surrounding area with film-forming gas If this is done, NiO is not formed on the metallic surface of the abovementioned metallic component, and an SiOCr film is formed. The SiOCr film does not react with reactive gases; accordingly, peeling and cracking do not occur. Furthermore, the SiOCr film blocks the out diffusion of metals centering on Cu contained in the metallic component, and prevents contamination of the substrate.

A fourth aspect is the first aspect, wherein the baking treatment to at least the metallic surface of the metallic component exposed to the inside of the processing chamber 201 is performed at a pressure less than atmospheric pressure, in a state of filling a surrounding area with inert gas, and further in a state of filling the surrounding area with film-forming gas.

In this case as well, a SiOCr film is formed on the metallic surface of the abovementioned metallic component. Since the SiOCr film does not react with reactive gases, peeling and cracking do not occur. Furthermore, the SiOCr film blocks the out diffusion of metals centering on Cu contained in the metallic component, and prevents contamination of the substrate.

A fifth aspect is the second or fourth aspect, wherein the abovementioned inert gas is nitrogen gas.

A sixth aspect is the third or fourth aspect, wherein the abovementioned film-forming gas is a mixed gas of ammonia gas and at least a Si-containing hydrogen compound gas.

A seventh aspect is the sixth aspect, wherein the abovementioned hydrogen compound gas containing Si is dichlorosilane gas or disilane gas.

An eighth aspect is the first, second, third, or fourth aspect, wherein at least the metallic surface of the metallic component that is exposed to the inside of the processing chamber 201 is reacted with oxygen in a state of having at least oxygen gas in the surrounding area after baking treatment at a pressure less than atmospheric pressure.

If oxygen is present in at least a surrounding area after baking treatment at a pressure less than atmospheric pressure, a Cr2O3 film is formed on the metallic surface that is exposed to the inside of the abovementioned processing chamber 201.

A ninth aspect is the first, second, third, or fourth aspect, wherein at least the metallic surface of the metallic component that is exposed to the inside of the processing chamber 201 is subjected to baking treatment at atmospheric pressure in a state of having atmospheric air in the surrounding area after baking treatment at a pressure less than atmospheric pressure.

If this is done, a NiO film is not formed on the metallic surface of the abovementioned metallic component, and a Cr2O3 film is formed.

A tenth aspect is the first, second, third, or fourth aspect, wherein the abovementioned metallic component is made of a nickel-chromium alloy. Nickel-chromium alloys contain trace amounts of Cu, and show out diffusion of metals centering on Cu; however, since the Cr2O3 film or SiOCr film blocks the out diffusion of metals centering on Cu contained in the metallic component, contamination of the substrate by metals is prevented.

An eleventh aspect is the first, second, third, or fourth aspect, wherein the abovementioned metallic component is constructed from an alloy that has a greater chromium component than iron component.

Inconel may be cited as an example of an alloy having a greater chromium component than iron component. Inconel contains trace amounts of Cu, and shows out diffusion of metals centering on Cu; however, since the $Cr_2O_3$ film or SiOCr film blocks the out diffusion of metals centering on Cu contained in the metallic component, contamination of the substrate by metals is prevented.

In a twelfth aspect, at least the metallic surface of the metallic component that is exposed to the inside of the processing chamber 201 is subjected to polishing treatment prior to the baking treatment. If the metallic surface of the abovementioned metallic component is subjected to polishing treatment as a pre-treatment, FeO films or NiO films that interfere with the formation of $Cr_2O_3$ films or SiOCr films can be removed. Furthermore, FeO films and NiO films are known to be formed on the metallic surface by casting.

A thirteenth aspect is the twelfth aspect, wherein the abovementioned polishing treatment is electrolytic polishing or mechanical polishing.

A fourteenth aspect is the first or second aspect, wherein a chromium oxide film ($Cr_2O_3$ film) is formed on at least the metallic surface of the abovementioned metallic component that is exposed to the inside of the abovementioned processing chamber 201 after the abovementioned baking treatment at a pressure less than atmospheric pressure.

A fifteenth aspect is the fourteenth aspect, wherein an SiOCr film is further formed on at least the metallic surface of the abovementioned metallic component exposed to the inside of the abovementioned processing chamber 201.

If a SiOCr film is formed on the Cr2O3 film, the effect in blocking the out diffusion of metals centering on Cu is improved.

A sixteenth aspect is the first or third aspect, wherein an SiOCr film is formed on at least the metallic surface of the abovementioned metallic component exposed to the inside of the abovementioned processing chamber 201 after the abovementioned baking treatment at a pressure that is less than atmospheric pressure.

A seventeenth aspect is a method of manufacturing a semiconductor device by using a substrate processing apparatus, with at least a part of a metallic surface of a metallic component exposed to the inside of a processing chamber 201 and at least the metallic surface subjected to baking treatment at a pressure that is less than atmospheric pressure. The method comprises the steps of loading a substrate into the processing chamber 201; subjecting the substrate to heat treatment in the inside of the processing chamber 201; and loading the substrate out of the processing chamber 201.

If this is done, metal contamination centering on Cu can be prevented, and defective operation of the semiconductor device can be prevented.

An eighteenth aspect is the seventeenth aspect, wherein the treatment is performed using a substrate processing apparatus in which a chromium oxide film is formed on the metallic surface exposed to the inside of the abovementioned processing chamber 201.

A nineteenth aspect is the seventeenth aspect, wherein the treatment is performed using a substrate processing apparatus in which an SiOCr film is further formed on the metallic surface exposed to the inside of the abovementioned processing chamber 201.

A twentieth aspect is the seventeenth aspect, wherein the treatment is performed using a substrate processing apparatus in which an SiOCr film is formed on the metallic surface exposed to the inside of the abovementioned processing chamber 201.

What is claimed is:

1. A substrate processing apparatus, comprising:
   a processing chamber that processes a substrate; and
   a metallic component having a SiOCr film at a surface of the metallic component,
   wherein the surface is exposed to an inside of the processing chamber prior to forming the SiOCr film, and
   wherein the SiOCr film is formed by a baking treatment of the metallic component that includes at least a first baking treatment being performed at a pressure less than atmospheric pressure, in a state of filling a surrounding area with a film-forming gas.

2. The substrate processing apparatus according to claim 1, wherein the film-forming gas is a mixed gas comprising ammonia gas and at least a Si-containing hydrogen compound gas.

3. The substrate processing apparatus according to claim 1, wherein the film-forming gas is dichlorosilane gas or disilane gas.

4. The substrate processing apparatus according to claim 1, wherein the surface is reacted with oxygen in a state of having at least oxygen gas in the surrounding area after the first baking treatment at the pressure less than atmospheric pressure is performed.

5. The substrate processing apparatus according to claim 1, wherein the surface is subjected to a second baking treatment of the baking treatment, the second baking treatment being performed at atmospheric pressure in a state of having atmospheric air in the surrounding area after the first baking treatment at the pressure less than atmospheric pressure.

6. The substrate processing apparatus according to claim 1, wherein the metallic component is constructed from an alloy that has a greater chromium component than iron component.

7. The substrate processing apparatus according to claim 1, wherein the surface is subjected to a polishing treatment prior to the first baking treatment.

8. The substrate processing apparatus according to claim 1, wherein a chromium oxide film is formed on the surface and then the SiOCr film is formed on the chromium oxide film.

9. The substrate processing apparatus according to claim 8, wherein:
   the chromium oxide film is formed by the first baking treatment at the pressure less than atmospheric pressure in a state of having atmospheric air in a surrounding area, and
   the SiOCr film is formed by a second baking treatment of the baking treatment, the second baking treatment being performed at a pressure less than atmospheric pressure in a state of filling the surrounding area with a film-forming gas after the first baking treatment.

10. The substrate processing apparatus according to claim 1, wherein a temperature of the surface during the first baking treatment is 200° C. or greater.

11. The substrate processing apparatus according to claim 1, wherein a temperature of the surface during the first baking treatment is 300° C. to 600° C.

12. The substrate processing apparatus according to claim 1, wherein the baking treatment is performed in a component stage before the metallic component is fitted to the substrate processing apparatus.

13. The substrate processing apparatus according to claim 1, wherein the first baking treatment is performed at a pressure of 1 Torr or less.

14. A method of manufacturing a semiconductor device for processing the substrate by using the substrate processing apparatus according to claim 1, comprising:
   loading a substrate into the processing chamber;
   subjecting the substrate to heat treatment while a reaction gas is supplied to the inside of the processing chamber; and
   unloading the substrate from the processing chamber.

* * * * *

UNITED STATES PATENT AND TRADEMARK OFFICE
CERTIFICATE OF CORRECTION

| | | |
|---|---|---|
| PATENT NO. | : 7,879,400 B2 | Page 1 of 1 |
| APPLICATION NO. | : 11/907270 | |
| DATED | : February 1, 2011 | |
| INVENTOR(S) | : Takahiro Maeda et al. | |

It is certified that error appears in the above-identified patent and that said Letters Patent is hereby corrected as shown below:

ON THE TITLE PAGE:

Change: Item (73) Assignee: Hitachi Kokusal Electric Inc., Tokyo (JP) to

Item (73) Assignee: Hitachi Kokusai Electric Inc., Tokyo (JP)

Signed and Sealed this
Twelfth Day of April, 2011

David J. Kappos
*Director of the United States Patent and Trademark Office*